(12) United States Patent
Elliott et al.

(10) Patent No.: US 6,392,777 B1
(45) Date of Patent: May 21, 2002

(54) OPTO-MECHANICAL DEVICE

(75) Inventors: Stephen Richard Elliott; Mark Edward Welland, both of Cambridge (GB); Pavel Krecmer, Praslavice (CZ)

(73) Assignee: Polight Technologies Limited, Cambridge (GB)

( * ) Notice: Subject to any disclaimer, the term of this patent is extended or adjusted under 35 U.S.C. 154(b) by 0 days.

(21) Appl. No.: 09/423,593

(22) PCT Filed: May 11, 1998

(86) PCT No.: PCT/GB98/01338

§ 371 Date: Nov. 12, 1999

§ 102(e) Date: Nov. 12, 1999

(87) PCT Pub. No.: WO98/52006

PCT Pub. Date: Nov. 19, 1998

(30) Foreign Application Priority Data

May 12, 1997  (GB) ............................... 9709612

(51) Int. Cl.[7] ................................. G02F 1/03
(52) U.S. Cl. ................... 359/244; 359/291; 359/246
(58) Field of Search ................. 359/291, 290, 359/245, 246, 321, 244

(56) References Cited

U.S. PATENT DOCUMENTS 4,002,975 A  * 1/1977  Erickson et al. ............... 324/96

OTHER PUBLICATIONS

Krecmer, P. et al., "Reversible Nanocontraction And Dilatation In A Solid Induced By Polarized Light," *Science*, Sep. 19, 1997. American Association Adv. Science, vol.277, No. 5333, pp. 1799–1802.

Suski, J. et al., "Optically Activated ZnO/SiO$_2$/Si Cantilever Beams," *Sensors and Actuators A*, vol. A24, No. 3, Sep. 1, 1990, pp. 221–225.

Kolobov, A.V. et al., "On the Mechanism of Photostructural Change in As–Based Vitreous Chalcogenides. microscopic, Dynamic and Electronic Aspsects, " *Philosophical Magazine B (Physics of Condensed Matter, Electronic, Optical and Magnetic Properties)*, Jan. 1994, vol. 69, No. 1, pp. 21–30.

Sheng–Yuan, Chu et al., "Photostrictive Effectin PLZTbased ceramics and Its Applications," *Ferroelectrics*, 1995, Gordon 7 Breach, vol. 174, No. 1–2, pp. 185–196.

Salib, M.S. et al., "Optomechanical Actuation Using Intercalated Graphite," *Carbon*, 1997, vol. 35 No. 5, pp. 709–711.

Fossheim et al., "Optomechanical Devices, Jun. 1976," *IBM Technical Disclousre Bulletin*, vol. 19, No. 1, Jun. 1976, p. 301.

Hisakuni, H. et al., "Giant Photoexpansion in As$_2$S$_3$ Glass," *Applied Physics Letters*, Dec. 5, 1994, vol. 65, No. 23, pp. 2925–2927.

* cited by examiner

*Primary Examiner*—Georgia Epps
*Assistant Examiner*—Tim Thompson
(74) *Attorney, Agent, or Firm*—Sughrue Mion, PLLC

(57) ABSTRACT

An opto-mechanical device is constituted by an optically responsive actuating member in which a mechanical strain occurs in response to changes in its illumination. The actuating member is preferably at least partly formed from a semiconducting glassy matrix such as a chalcogenide glass. Preferably the opto-mechanical device illuminates the actuating member with light which is preferably plane polarized. Preferably it also varies the polarization angle of the plane polarized light to cause a change in the strain generated in the actuating member.

10 Claims, 2 Drawing Sheets

OPTO-MECHANICAL DEVICE

BACKGROUND TO THE INVENTION

With piezo-electric materials when an electrical field is applied across them a mechanical strain results. This mechanical strain results in expansion or contraction of the piezo-electric material. Accordingly piezo-electric materials can be used to provide mechanical movement in response to an applied electric field. They are particularly used where only small movements are required, for example, on the stages of scanning electron microscopes or in micromanipulators.

STATEMENT OF THE INVENTION

According to this invention an opto-mechanical device comprises an optically responsive actuating member in which a mechanical strain occurs in response to changes in its illumination.

The optically responsive actuating member is preferably at least partly formed from a semiconducting glassy matrix. Preferably the semiconducting glassy matrix includes a group VI element alone or in combination with at least one element from the same or a different group of the periodic table. Such material is often referred to as a chalcogenide glass. Whilst the elements forming the semiconducting glassy matrix may be in stoichiometric proportions it is preferred that they are in non-stoichiometric proportions. Other materials such as photo-active polymers which demonstrate photo-anisotropy can also be used.

Preferably the opto-mechanical device includes means to illuminate the actuating member. The illumination means may be formed by an optical waveguide or may include a light emitting source arranged to illuminate the actuating member directly or via a coupling fibre or lens, or may simply be a window in an otherwise opaque housing or package containing the device to allow light to impinge upon the actuating member. When the illumination means includes an optical waveguide the illuminating light may be evanescently coupled to the actuating member or the output from the waveguide used to illuminate the actuating member. It is also possible for the actuating member itself to act as a waveguide and, in this case, the illumination means may be coupled to the actuating member.

The mechanical strain in the actuating member resulting from its illumination is provided by two different effects. Firstly there is a scalar effect in which when an initially isotropic semiconducting glassy matrix is illuminated by unpolarised light it expands. This expansion produces a metastable state and the semiconducting glassy matrix can be returned to its isotropic state by heating. An opto-mechanical device using this scalar effect has only limited application.

The inventors of the present application have discovered that there is also an additional vectorial change in the mechanical strain generated in the actuating member when it is illuminated with polarised light. When the semiconducting glassy matrix is illuminated with polarised light having its electric vector in a predetermined direction this produces a strain in the matrix which causes it to contract in the predetermined direction. Conversely, illuminating the semiconducting glassy matrix with light polarised to have its electric vector orthogonal to the predetermined direction produces a strain in it which causes it to expand in the predetermined direction. This expansion or contraction is again a metastable state of the actuating member and this metastable state can once again be relieved by the application of heat. However, much more usefully the metastable state can be changed by merely changing the orientation of the polarisation of light being used to illuminate the actuating member. Accordingly, by changing the state or angle of polarisation of the illuminating light a corresponding change in the mechanical strain of the actuating member occurs and hence a corresponding change in its contraction or expansion can be made to occur. This change is completely reversible and repeatable and there is, for example, no hysteresis as occurs in piezo-electric actuating members.

Preferably therefore the opto-mechanical device also includes means to illuminate the actuating member with a source of polarised light and preferably includes means to vary the angle of polarisation of the light applied to the actuating member. In this case the means to illuminate the actuating member is preferably polarisation-preserving and may include a polarisation-preserving optical fibre and may include an electro-optical modulator to vary the angle of polarisation of the light applied to the actuating member. Other ways of changing the angle of polarisation of the light applied to the actuating member include switching between light of perpendicular polarisation states by switching between differently polarised light sources or by, for example, switching a half wavelength plate into the optical path.

The linear expansion or contraction of the semiconducting glass matrix on its illumination is only small, for example of the order of 1:200,000. The change also only occurs in regions which are illuminated by the light and so tends to occur only in a reasonably shallow surface layer of the glassy matrix into which the illuminating light penetrates. It is believed that, in the case of chalcogenide glasses, the effect is caused by the incoming photons of the illuminating light exciting one or more of the lone-pair electrons in the p-orbital of the outer shell of the group VI element and, having excited these electrons, an electron-hole pair is created which no longer has the spatial symmetry of the lone-pair orbital and, due to the change of interatomic potential leads to a swing of the chalcogen atom resulting in a local distortion of the glass leading to expansion or contraction.

Inevitably the light is absorbed by the glass and its energy is transferred to the excitation of the lone-pair electrons. Accordingly the light is not able to penetrate far into the glassy matrix before being absorbed. If reasonably strongly absorbed it typically penetrates to a depth of about 1 $\mu$m.

It is possible for the actuating member to be substantially entirely formed by the semiconducting glassy matrix and in this case a simple change in length of the actuating member occurs as a result of changes in its illumination. Since the change in length is only small this change in length is difficult to detect and certainly difficult to use directly. Preferably therefore, the actuating member includes a substrate which is unaffected by changes in illumination. Preferably the actuating member is formed by a layer of the semiconducting glassy matrix bonded to the substrate. Preferably the thickness of the semiconducting glassy matrix and the substrate are comparable with one another. In this case when the layer of semiconducting glassy matrix expands or contracts upon changes in its illumination, its expansion or contraction relative to the substrate causes the actuating member to bend in much the same way as a bi-metallic strip bends in response to changes in temperature. This results in a very much greater mechanical displacement of the actuating member than that resulting from the expansion or contraction of the semiconducting glassy matrix alone. For example by mounting such an actuating member as a cantilever, the free end of the cantilever is capable of moving a distance a few orders of magnitude greater than the simple change in length of the semiconducting glassy matrix. Equally if the actuating member is mounted so that it is constrained at both ends it bows and flattens with changes in illumination and its central portion again moves a distance which is considerably greater than that of the change in length of the semiconducting glassy matrix.

The opto-mechanical device in accordance with this invention may be used as a sensor to detect the presence of light or its polarisation state with the resulting mechanical strain in the actuating member being used to indicate the presence or polarisation state of the light. The mechanical strain of the actuating member may be monitored directly or preferably, monitored via a secondary system. Another use of the opto-mechanical device in accordance with this invention is to create a mechanical movement to do direct work, for example by using the actuating member as part of a micro- or nano-manipulator and using the change in size of the actuating member to move a workpiece being handled by the micro- or nano-manipulator. A further application is to use the opto-mechanical device to perform a control function on a secondary system and thereby control the secondary system in response to changes in the light illuminating the actuating member.

The secondary system may be any one which responds to mechanical strain or movement and thus, for example, the secondary system may include an optical lever comprising a laser beam which is reflected from the actuating member or an element connected to it and then impinges upon a position-sensitive photo-detector so that as the actuating member moves or bends the effect of its movement turns the optical lever formed by the laser beam so that it moves along the position-sensitive photo-detector. The output of the position-sensitive photo-detector then gives an indication of the mechanical movement of the actuating member and hence of the illumination applied to it. The actuating member may include a metal electrode and in this case the mechanical movement of the actuating member and its associated electrode towards or away from an associated electrode provides a change in capacitance between the two electrodes. This change in capacitance may be monitored to give a representation of the mechanical movement of the actuating member and hence of the illumination applied to it. Equally, the substrate may be formed by a piezo-resistive material the resistance of which changes as a result of a strain imposed upon it. Accordingly, in this case, as a result of a change in strain in the substrate caused by the strain in the semiconducting glassy matrix, the electrical resistance varies so resulting in a change in resistance being used to provide an indication of the change in strain of the semiconducting glassy matrix and hence its illumination. A further way in which the actuating member can be used to control a secondary system is in the case where the secondary system is a fluidic system. In this case the actuating member may be arranged close to a nozzle in a fluidic system so that as the illumination of the actuating member varies and hence its displacement varies, it gets closer to or further away from the nozzle so varying the rate of flow through the nozzle and hence the back pressure upstream of the nozzle. In this way the opto-mechanical device can be used to influence a fluidic system and thus produce a light sensor or a controller which is responsive to the light input into the device which, being completely free from electrical contacts, would be intrinsically safe in an explosive environment.

Not only can the actuator do direct work as a micro-manipulator it is also possible for it to do direct work as the actuating member of a pump. An example of this is where the semiconducting glassy matrix is formed on a planar substrate so that with changes in its illumination the actuating member bows. By changing the illumination of the actuating member so that it alternately bows and flattens it can be used as a diaphragm of a diaphragm pump. It is also conceivable that it can be used as an optically powered motor by taking the reciprocating movement either from such a diaphragm or from a cantilever arm and converting this into a rotation.

When the elements forming the semiconducting glassy matrix are in non-stoichiometric proportions the exact composition of it can be tailored to influence and suit its intended use. Firstly, by selecting and varying the proportions of the element or other elements in the semiconducting glassy matrix the band gap of the semiconductor can be varied and so matched to the energy of the light which is used to illuminate the actuating member. Clearly this can be used to make the actuating member selective to light of a predetermined wavelength where the actuating member is used to detect light of a predetermined wavelength or alternatively merely to match the actuating member to the wavelength of light output by a light source used with the opto-mechanical device and thereby optimise its sensitivity. It is also possible to change the rigidity of the glass material and, in this way affect the amount of expansion and contraction that occurs. For example, introducing iodine into the semiconducting glassy matrix appears to make it less rigid and so causes greater expansion and contraction of the matrix for a given change in illumination. Equally, the introduction of germanium into the semiconducting glassy matrix appears to make it more rigid and so results in a lower expansion and contraction for the given change in illumination.

Another way in which the composition of the semiconducting glassy matrix can be tailored to be given particular advantages is by changing its composition so that, for example, its thermal expansion is substantially the same as the thermal expansion of any substrate used in the actuating member. In this way the actuating member can be made insensitive to thermal changes so it only responds to changes in illumination. Equally, by changing the composition, the scalar effect of illumination can be enhanced or suppressed. Clearly where it is the response of the opto-mechanical device to the scalar effect of illumination which is used it is required to increase the sensitivity of the device to the scalar effect and, reduce as far as possible, the effect of any change in polarisation whereas, more usually, where it is the response to a particular polarisation state that it is required it is important to suppress, as far as possible, the scalar effect.

Typically the semiconducting glassy matrix may be formed by melting the ingredients in bulk and then subsequently working the melt by conventional glass working techniques to provide the actuating member. Particularly where it is to be formed as a thin film on a substrate it may be formed by sputtering, chemical vapour deposition or by evaporation. One chalcogenide glass which has shown good results when used as the semiconducting glassy matrix is $As_{50} Se_{50}$ particularly when this is combined with a substrate of silicon nitride.

BRIEF DESCRIPTION OF THE DRAWINGS

Three examples of opto-mechanical devices in accordance with this invention will now be described with reference to the accompanying drawings, in which.

DESCRIPTION PREFERRED EXAMPLES

Figure 1:
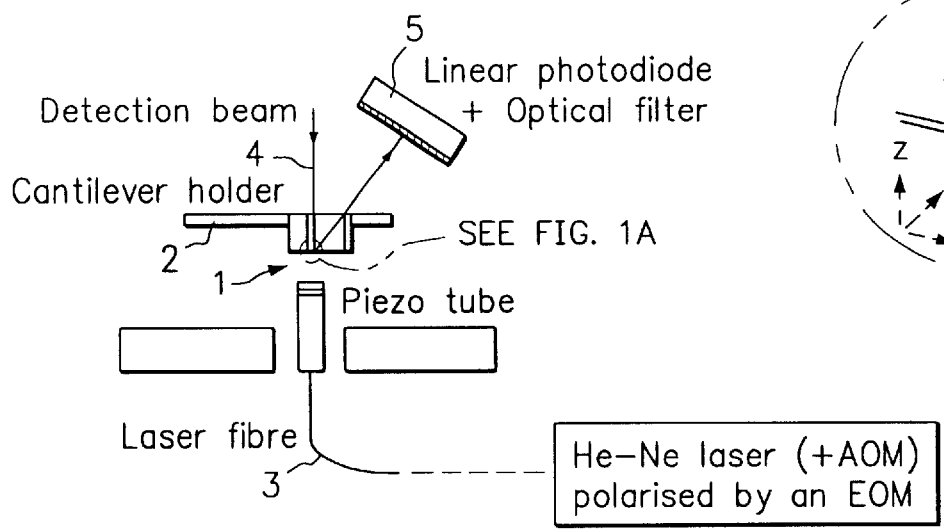
FIG. 1 is a diagrammatic side elevation of a device including a cantilevered actuating member used to demonstrate the use of this invention as a nano-manipulator.
Figure 1A:
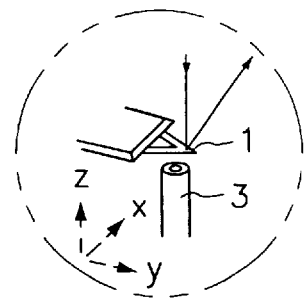

An atomic force microscope typically includes commercially available V-shaped microcantilevers 1. They are fabricated from silicon nitride with typical dimensions 200 $\mu$m length, 20 $\mu$m width and 0.6 $\mu$m thickness. Such microcantilevers 1 are used in an atomic force microscope as a test rig for the present invention. One surface of the microcantilevers 1 is coated with a thin layer, about 20 nm thick, of gold to increase its optical reflectivity. The other surface has a thin amorphous $As_{50}Se_{50}$ film of thickness about 250 nm evaporated onto it. The microcantilever 1 is then mounted on a cantilever holder 2 of an atomic force microscope. A helium-neon laser, the output of which is square-wave modulated at around 50 Hz by an acousto-optic modulator (AOM) and then polarised in an electro-optic modulator (EOM) is guided via a polarisation preserving fibre 3 and used to illuminate the whole of the surface of the amorphous $As_{50}Se_{50}$ film.

To monitor movement of the microcantilever 1 in this test rig, a probe laser beam 4 was focused onto the gold plated surface of the end of the microcantilever 1 and the light reflected from the end of the cantilever 1 received by a linear photodiode and optical filter 5. Any bending or deflection of the microcantilever thus causes a deflection of the probe laser beam 4 and hence varies the output of the photodiode 5.

Figure 2:
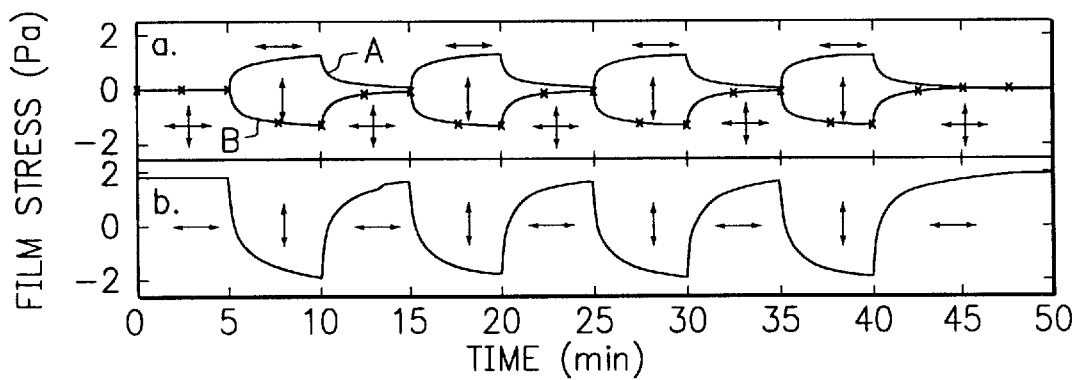
FIG. 2 is graphs illustrating the change in strain of the actuating member upon its illumination.

FIG. 2a shows a combination of two traces monitoring the movement of the cantilever when exposed to unpolarised light and polarised light in one direction (trace A) or unpolarised light and polarised light polarised in an orthogonal direction (trace B). This shows how, when exposed to light of opposite polarisation states, the microcantilever bends either upwards or downwards. FIG. 2b illustrates the effect of changing the illumination of the microcantilever 1 from light of one polarisation state to light of the orthogonal polarisation state. Note that this shows that the amplitude of the bending of the microcantilever between opposite polarisation states is twice that between unpolarised and a single polarisation state.

When using the microcantilever as a nano-manipulator the end of it typically holds the sample or workpiece to be moved and then, moves the sample or workpiece as illumination of the microcantilever is varied. It is possible to obtain a resolution of about ±1 nm in this way. The absence of an applied electric field to such a micro or nano-manipulator has considerable advantages when it is used in an electron microscope or an atomic force microscope.

Figure 3:
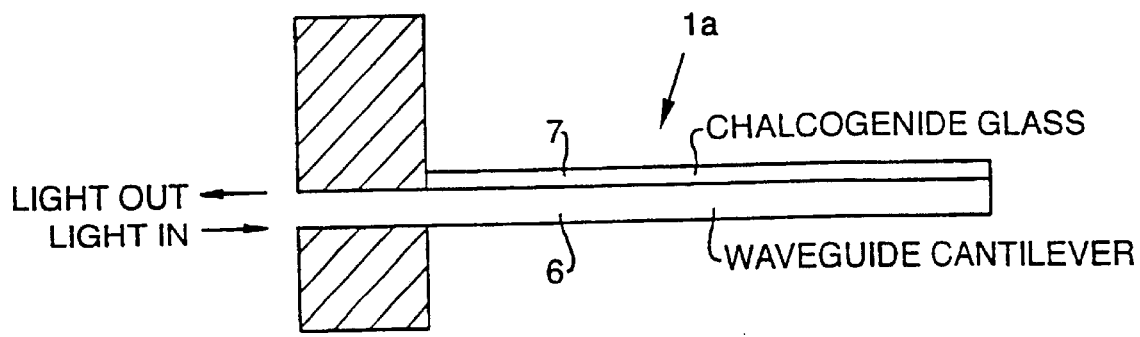
FIG. 3 is a side elevation of a modified cantilever arm to a greatly enlarged scale; and, FIG. 4 is a diagram of an opto-mechanical device for controlling a fluidic system.

FIG. 3 shows a modification of a cantilever 1a for use in a nano-manipulator. In this example the substrate 6 of the cantilever 1a is formed as a light waveguide out of doped silica, for example. An upper layer 7 of chalcogenide glass is then formed on its upper surface. Light used to illuminate the cantilever 1a is then coupled into the end of the substrate 6 and this is evanescently coupled to the layer 7 of chalcogenide glass. As an alternative the cantilever 1a could be fabricated from an etched optical fibre with its core exposed as the actuating member.

An advantage of these modifications is that light reflected back down the waveguide 6 has an intensity which is a function of the degree of bending of the cantilever and so it can be used as a feedback control.

Figure 4:
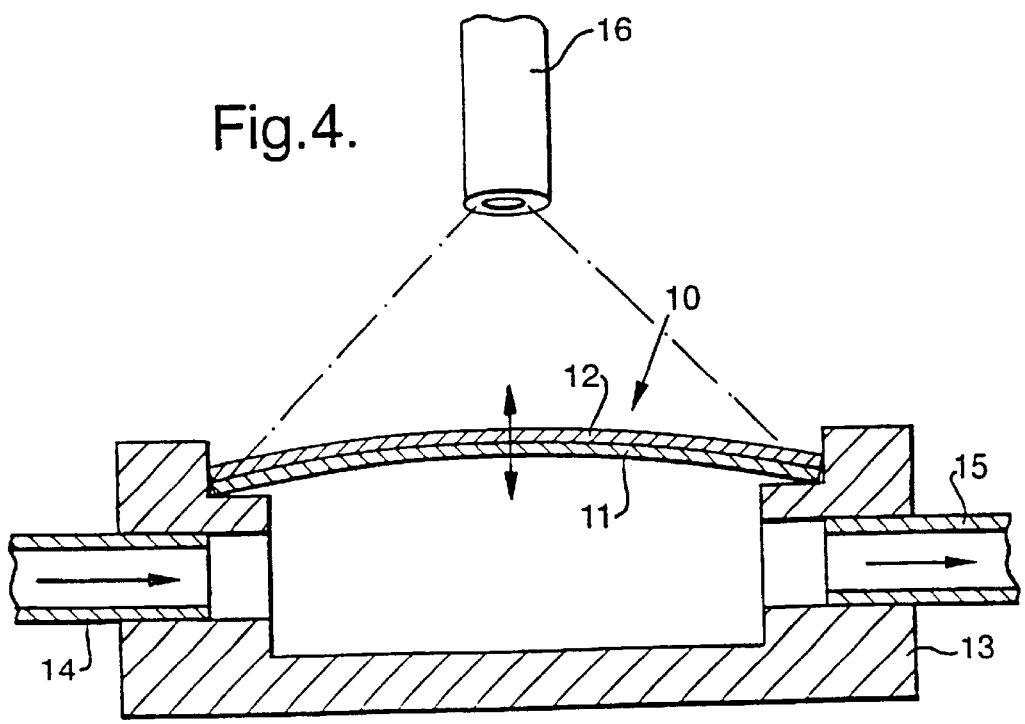

FIG. 4 shows how a device in accordance with the present invention can be used as a pump. In FIG. 4 an actuating member 10 comprising a substrate layer 11 and an upper layer of glassy matrix 12 forms the upper surface of a chamber 13. The chamber has a fluid inlet pipe 14 and a fluid exit pipe 15 both of which include non-return values not shown in the drawing. Light from optical fibre 16 impinges on the glassy matrix 12 of the actuating member 10 and as the polarisation of the light leaving the optical fibre 16 changes between two orthogonal polarisation states the actuating member 11 alternately bows into and out of the chamber 13. As the actuating member 10 flexes alternately it varies the volume of the chamber 13 and hence acts as the diaphragm of a diaphragm pump to pump fluid from the inlet pipe 14 through the outlet pipe 15.

What is claimed is:

1. An opto-mechanical device comprising an optically responsive actuating member at least partly formed from a chalcogenide glass consisting of a group VI element alone or in combination with at least one element from the same or a different group of the periodic table, in which a mechanical strain occurs in the optically responsive actuating member in response to changes in its illumination and in which a change in the mechanical strain of the actuating member and hence a corresponding change in its contraction and expansion occurs in response to changes in the state or angle of polarisation of the illuminating light.

2. An opto-mechanical device according to claim 1, which includes means to illuminate the actuating member.

3. An opto-mechanical device according to claim 2, which includes means to illuminate the actuating member with a source of polarised light and includes means to vary the angle of polarisation of the light applied to the actuating member.

4. An opto-mechanical device according to claim 3, in which the means to illuminate the actuating member is a polarisation-preserving optical fibre and the means to vary the angle of polarisation includes an electro-optical modulator to polarise and vary the angle of polarisation of the light applied to the actuating member.

5. An opto-mechanical device according to claim 1, in which the actuating member includes a substrate which is unaffected by changes in illumination.

6. An opto-mechanical device according to claim 5, in which the thickness of the optically responsive component and the substrate are comparable with one another, so that when the optically responsive component expands or contracts upon changes in its illumination, its expansion or contraction relative to the substrate causes the actuating member to bend.

7. An opto-mechanical device according to claim 6, in which the actuating member is mounted as a cantilever, the free end of which is capable of moving a distance a few orders of magnitude greater than the simple change in length of the optically responsive component.

8. An opto-mechanical device according to claim 6, which is arranged to act as a sensor to detect the presence of light or its polarisation state with the resulting mechanical strain in the actuating member being used to indicate the presence or polarisation state of the light, and which includes a secondary system to monitor the mechanical strain of the actuating member.

9. An opto-mechanical device according to claim 1, in which, in use, the actuator creates a mechanical movement to do direct work.

10. An opto-mechanical device according to claim 1 wherein the proportions of the element or other elements in the chalcogenide glass are selected and varied to make the actuating member selective to light of a predetermined wavelength.

* * * * *